(12) United States Patent
Yamashita

(10) Patent No.: US 8,416,327 B2
(45) Date of Patent: Apr. 9, 2013

(54) SOLID-STATE IMAGE PICKUP APPARATUS

(75) Inventor: Hirofumi Yamashita, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 167 days.

(21) Appl. No.: 12/562,610

(22) Filed: Sep. 18, 2009

(65) Prior Publication Data

US 2010/0085457 A1 Apr. 8, 2010

(30) Foreign Application Priority Data

Oct. 7, 2008 (JP) .................................. 2008-260796

(51) Int. Cl.
H04N 9/09 (2006.01)

(52) U.S. Cl.
USPC ........................... 348/265; 348/267; 348/294

(58) Field of Classification Search .................. 348/265, 348/267
See application file for complete search history.

(56) References Cited

U.S. PATENT DOCUMENTS

| 6,833,873 | B1 * | 12/2004 | Suda ............................. 348/340 |
| 7,294,873 | B2 | 11/2007 | Suzuki et al. |
| 7,453,510 | B2 * | 11/2008 | Kolehmainen et al. ....... 348/340 |
| 2002/0067416 | A1 * | 6/2002 | Yoneda et al. ................. 348/304 |
| 2002/0113888 | A1 * | 8/2002 | Sonoda et al. ................. 348/315 |
| 2004/0012698 | A1 * | 1/2004 | Suda et al. ..................... 348/315 |
| 2004/0100570 | A1 * | 5/2004 | Shizukuishi ................... 348/272 |
| 2005/0134712 | A1 * | 6/2005 | Gruhlke et al. ............... 348/272 |
| 2008/0068477 | A1 * | 3/2008 | Iida et al. ...................... 348/294 |
| 2011/0228153 | A1 * | 9/2011 | Chevallier .................... 348/308 |

FOREIGN PATENT DOCUMENTS

| JP | 2001-78212 | 3/2001 |
| JP | 2001-78213 | 3/2001 |
| JP | 2001-78214 | 3/2001 |
| JP | 2001-78215 | 3/2001 |
| JP | 2002-125242 A | 4/2002 |
| JP | 2005-176117 A | 6/2005 |
| JP | 2006-32561 A | 2/2006 |
| JP | 2006-246193 | 9/2006 |
| KR | 10-0222771 | 10/1999 |
| KR | 10-2006-0093285 | 8/2006 |

OTHER PUBLICATIONS

Fossum, Eric, "CMOS Image Sensors: Electronic Camera-On-A-Chip", Oct. 1997, IEEE, vol. 10.*
Office Action issued Jun. 15, 2011 in China Application No. 200910176376.7.
Office Action issued Nov. 12, 2011, in Korean Patent Application No. 10-2009-94482 with English translation.
Combined Chinese Office Action and Search Report issued Aug. 3, 2012 in Chinese Patent Application No. 200910176376.7 (with English-language translation).
Office Action issued Jul. 17, 2012 in Japanese Patent Application No. 2008-260796 (with English-language translation).

* cited by examiner

Primary Examiner — Anthony J Daniels
(74) Attorney, Agent, or Firm — Oblon, Spivak, McClelland, Maier & Neustadt, L.L.P.

(57) ABSTRACT

A plurality of image pickup areas is disposed in a semiconductor substrate so as to be separate from one another. Disposed in each of the image pickup areas are rows and columns of unit pixels, each of which includes a photoelectric conversion part and signal scanning circuit parts. Formed on the image pickup areas of the semiconductor substrate and opposite a interconnect layer formed on the semiconductor substrate are optical image formation lenses used for forming object images. Further, between the image pickup areas on the semiconductor substrate is a driving circuit area in which driving circuits are formed for driving the signal scanning circuit parts.

7 Claims, 8 Drawing Sheets

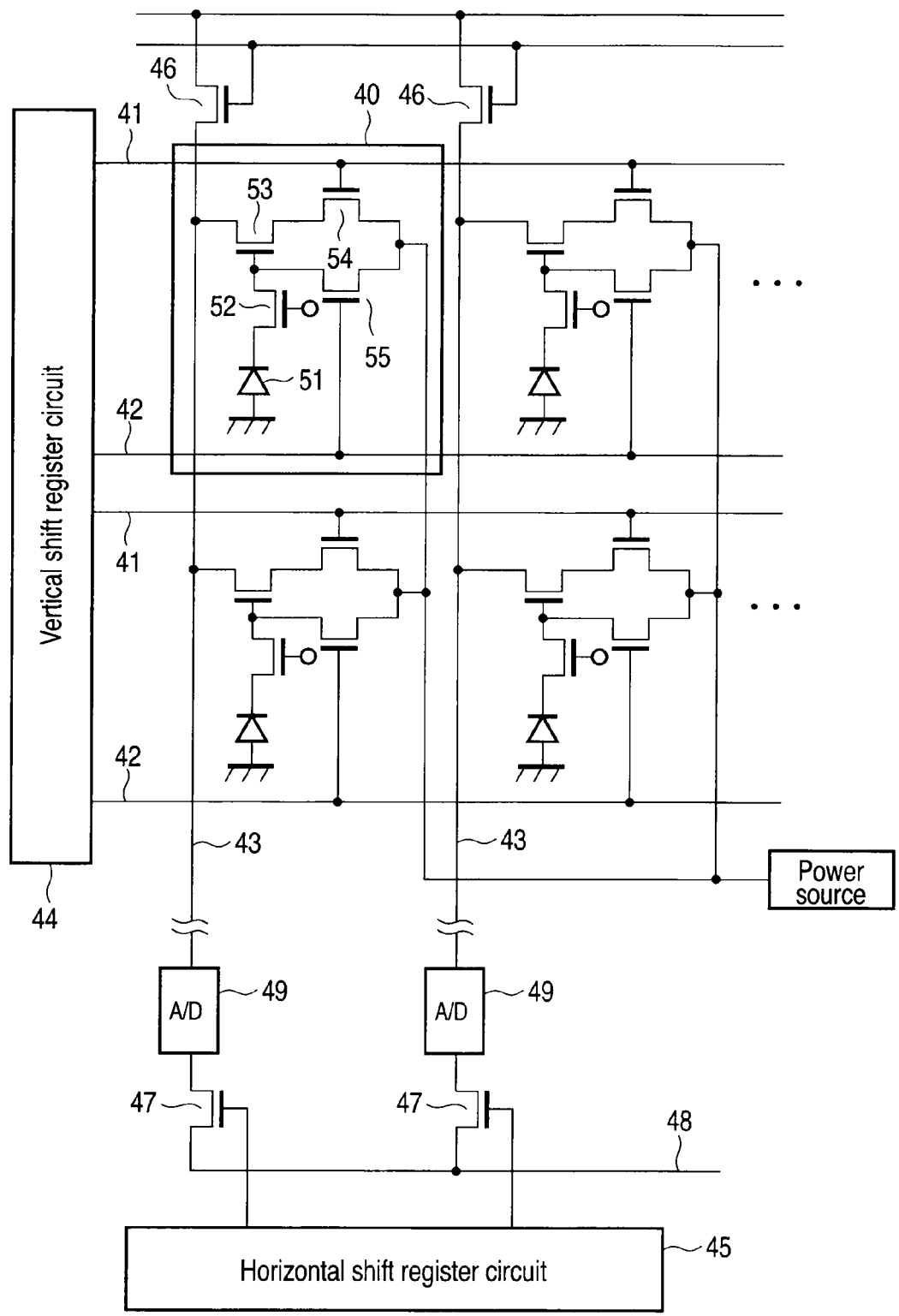
F I G. 6

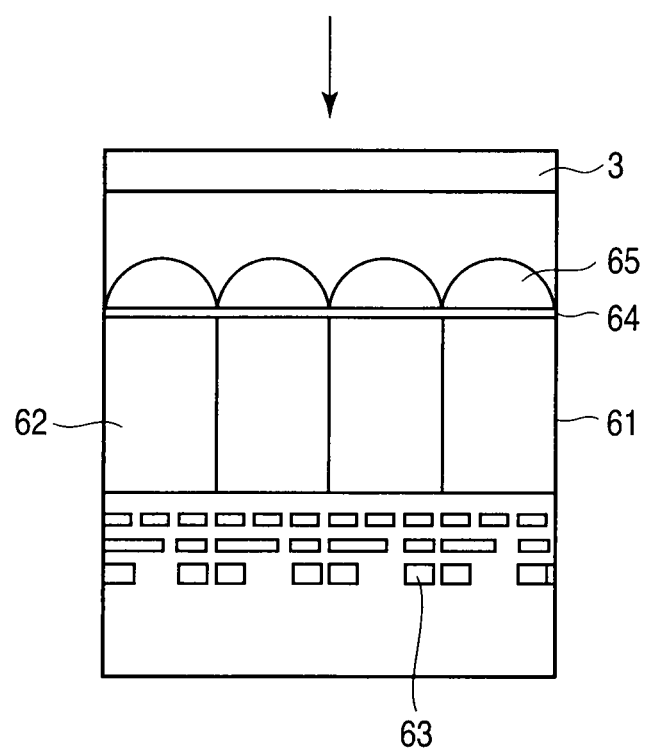
F I G. 7

SOLID-STATE IMAGE PICKUP APPARATUS

CROSS-REFERENCE TO RELATED APPLICATIONS

This application is based upon and claims the benefit of priority from prior Japanese Patent Application No. 2008-260796, filed Oct. 7, 2008, the entire contents of which are incorporated herein by reference.

BACKGROUND OF THE INVENTION

1. Field of the Invention

The present invention relates to a solid-state image pickup apparatus, particularly to a solid-state image pickup apparatus that captures a plurality of items of color data by means of a plurality of pixel arrays.

2. Description of the Related Art

Modern solid-state image pickup devices, typically fabricated using complementary metal-oxide semiconductor (CMOS) technology, have various applications, such as in digital still cameras, camcorders, surveillance cameras, etc. Of these solid-state image pickup devices, the single-chip type, which captures a plurality of items of color data by means of a single pixel-array, is the most common.

Continuing demand to further increase the pixel count, reduce the size of an image pickup device optical system, etc., has led to a reduction in pixel size. Pixel size reduction decreases the area of an image pickup area and hence the area of the image pickup device optical system, and reduces focal length, thus allowing a reduction in the height of the image pickup device optical system. The pixel sizes of CMOS sensors used in current digital cameras, etc., range from about 1.4 to 2.8 µm. However, such very small pixels cause problems as described below.

First, if the pixel size is reduced, the number of photons able to impinge on a unit pixel decreases in proportion to the area of the unit pixel. Accordingly, the video signal-to-noise ratio decreases. If the signal-to-noise ratio cannot be maintained, the quality of reproduced images on a display screen will be degraded.

Second, if the pixel size is reduced, crosstalk between adjacent pixels increases. Consequently, pixels assigned for sensitivity to corresponding specific wavelength areas may become sensitive to other wavelengths as well. This may result in color mixing and significant degradation in color reproducibility on a display screen.

Therefore, in order to maintain a high signal-to-noise ratio despite a pixel size reduction and minimize sensitivity degradation, any decrease in the signal-to-noise ratio has to be prevented. In addition, in order to prevent degradation in color reproducibility because of pixel size reduction, and to minimize color mixing, some ingenuity is required. Since an image pickup device has these characteristic drawbacks, it is difficult to reduce pixel size. Accordingly, the image pickup device optical system size cannot be reduced sufficiently.

In order to reduce the foregoing problems, in particular, in order to decrease the thickness of an image pickup device optical system, technologies have conventionally been proposed as in Jpn. Pat. Appln. KOKAI Publication Nos. 2001-78212 and 2006-246193. In these technologies, a plurality of image pickup devices is divided into a plurality of image pickup areas; optical image formation systems are provided for the corresponding image pickup areas; and spectral filters are provided for the corresponding optical image formation systems so as to receive the incident light rays having spectral distributions that differ among the image pickup areas. In this case, the image pickup areas are disposed in contact with one another. Dividing one large image pickup area into several separate image pickup areas in this way makes it possible to reduce the size of each image pickup area and hence the height of the corresponding optical image formation system in the direction of the optical axis. This realizes a camera module of low height.

However, disposing a plurality of image pickup areas in contact with one another generates the following problems: the size of image circle formed by each optical image formation system is larger than the area of the corresponding image pickup area such that light from the optical image formation system disposed in the image pickup area projects onto the adjacent image pickup area, with the result that this light produces a false signal, resulting in significant degradation of the image quality on the display screen. Therefore, the image pickup apparatuses disclosed in the foregoing publications adopt a structure in which a light shield effect is applied between the optical image formation systems.

However, such a method is insufficient to prevent a false signal from entering adjacent image pickup areas. Equally, light reflection may be caused by a light shield wall, leading to vignetting and hence flare. Accordingly, the quality of a reproduced image may be significantly degraded.

BRIEF SUMMARY OF THE INVENTION

According to a first aspect of the present invention, there is provided a solid-state image pickup apparatus comprising:

a plurality of image pickup areas configured to dispose in a semiconductor substrate, each image pickup area being separated from one another, each image pickup area having rows and columns of unit pixels, each unit pixel including a photoelectric conversion part and a signal scanning circuit part;

an image pickup device optical system configured to form object images on the plurality of image pickup areas on the semiconductor substrate and opposite a interconnect layer formed on the semiconductor substrate; and a driving circuit area configured to dispose in the semiconductor substrate and between the plurality of image pickup areas and having a driving circuit formed to drive the signal scanning circuit part.

According to a second aspect of the present invention, there is provided a solid-state image pickup apparatus comprising:

a plurality of image pickup areas each of which has, in a semiconductor substrate, rows and columns of unit pixels, each unit pixel including a photoelectric conversion part and a signal scanning circuit part; and an image pickup device optical system configured to form object images on the plurality of image pickup areas on the semiconductor substrate and opposite a interconnect layer formed on the semiconductor substrate, wherein the plurality of image pickup areas are formed in the semiconductor substrate to be separate from one another by distances sufficient to prevent the object images formed by the corresponding image pickup device optical systems from overlapping one another.

BRIEF DESCRIPTION OF THE SEVERAL VIEWS OF THE DRAWING

FIG. 6 is a circuit diagram showing an example of an equivalent circuit for the image pickup area shown in FIG. 2, together with a driving circuit and an analog-to-digital converter;

FIG. 7 is a detailed sectional view of the image pickup areas of the image pickup chip shown in FIG. 2, together with a spectral filter;

DETAILED DESCRIPTION OF THE INVENTION

Referring to the accompanying drawings, embodiments of the present invention will hereinafter be described in detail. In all the drawings, identical elements are labeled with the same reference numbers and duplicate explanations are not given.

First Embodiment

Figure 1:
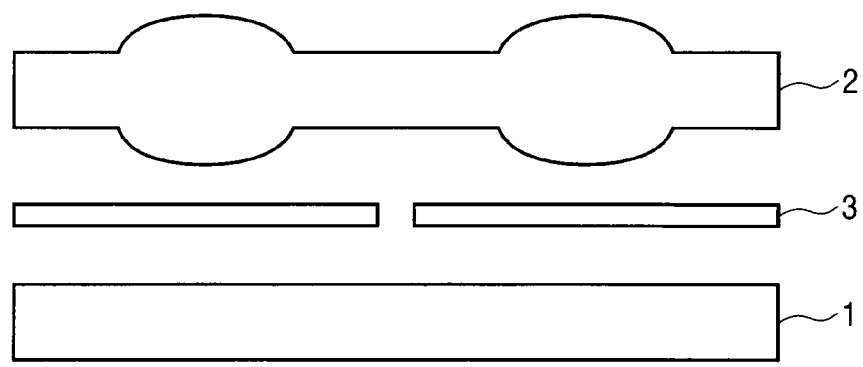
FIG. 1 is a sectional view of a solid-state image pickup apparatus according to a first embodiment.

FIG. 1 is a sectional view of a solid-state image pickup apparatus according to a first embodiment. This solid-state image pickup apparatus includes: an image pickup chip 1, which is a silicon semiconductor substrate in the form of a chip; optical image formation lenses 2 disposed above the image pickup chip 1; and spectral filters (color filters) 3 disposed between the image pickup chip 1 and optical image formation lenses 2. The spectral filters 3 (described below) are formed on the image pickup chip 1.

Figure 2:
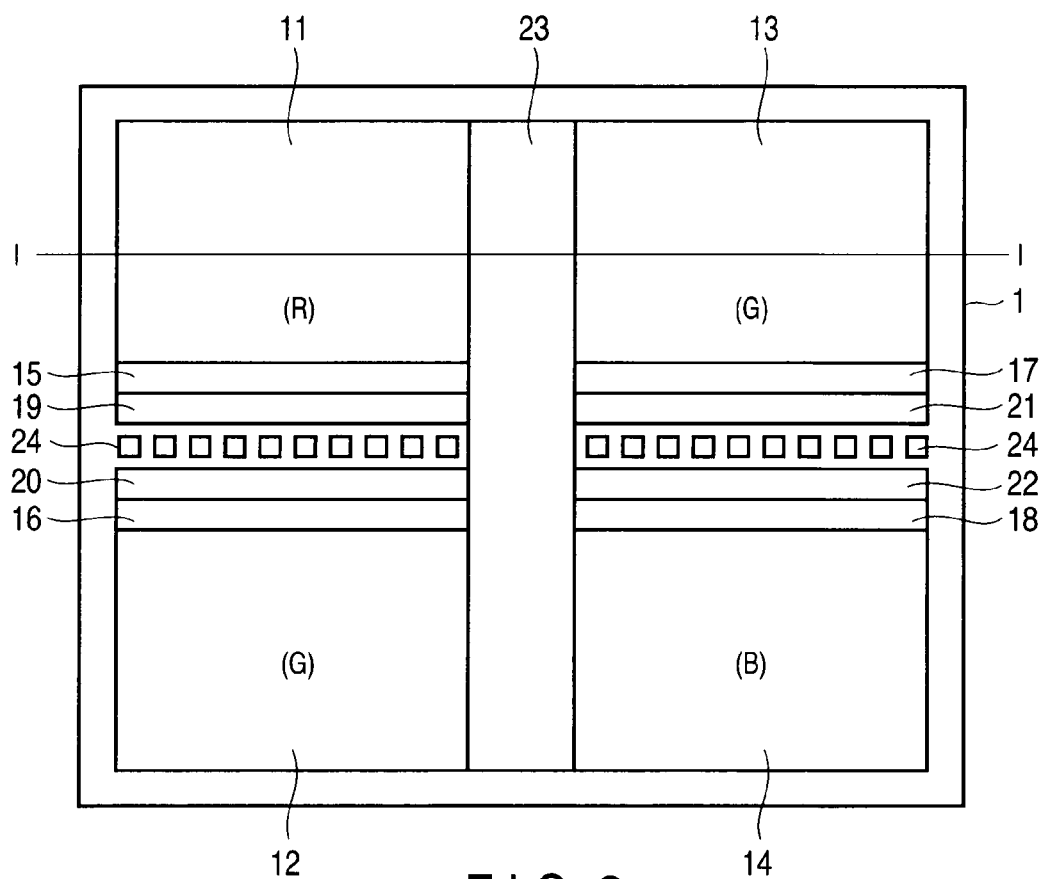
FIG. 2 is a plan view of an example of an image pickup chip shown in FIG. 1.

FIG. 2 is a plan view of an example of the image pickup chip 1 shown in FIG. 1. As shown in FIG. 2, the image pickup chip 1 has a plurality of image pickup areas (i.e., pixel arrays). In the present embodiment, the image pickup chip 1 has four image pickup areas 11 to 14. These four image pickup areas 11 to 14 are arranged in two rows and two columns (two rows×two columns) on the silicon semiconductor substrate such that they are separate from one another. Each of the image pickup areas 11 to 14 is formed from rows and columns of unit pixels (unit cells), each unit pixel including a photoelectric conversion part and signal scanning circuit parts.

Disposed adjacent to the image pickup areas 11, 12, 13, are 14 are analog-to-digital conversion circuit areas 15, 16, 17, and 18, respectively, in which a plurality of analog-to-digital converters are disposed. Each of the analog-to-digital converters formed in the corresponding analog-to-digital conversion circuit areas 15 to 18 converts an analog signal photoelectrically converted from a unit pixel in the corresponding image pickup area into a digital signal. Further, adjacent to the analog-to-digital conversion circuit areas 15 to 18 are digital signal processing circuit areas 19 to 22, respectively, in which digital signal processing (DSP) circuits are formed for performing signal processing upon input of digital signals converted from analog signals by the analog-to-digital converters in the corresponding analog-to-digital conversion circuit areas.

In addition, between the four image pickup areas 11 to 14 is a driving circuit area 23 in which driving circuits are disposed for driving the signal scanning circuit parts disposed in the image pickup areas 11 to 14. In the present embodiment, in FIG. 2, the driving circuit area 23 extends vertically between the image pickup areas 11 and 13 and between the image pickup areas 12 and 14, all of which are also arranged vertically.

Figure 3:
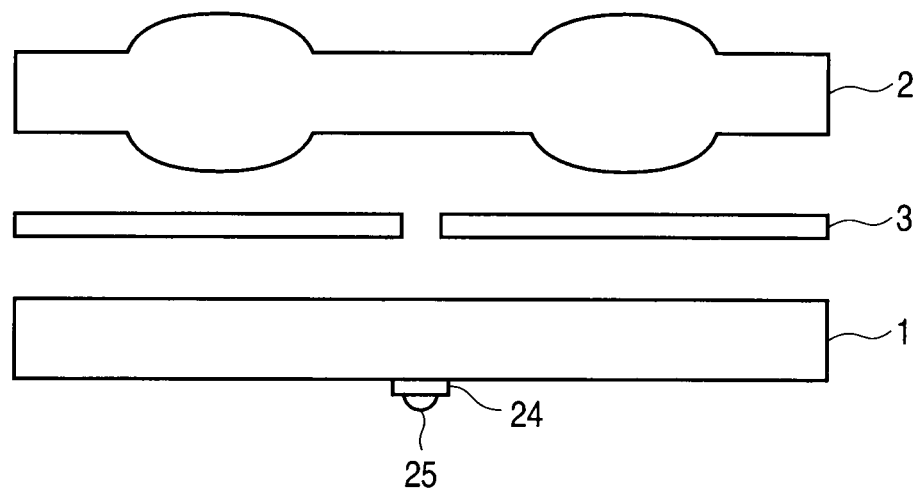
FIG. 3 is a sectional view of the solid-state image pickup apparatus shown in FIG. 1, in which a ball electrode is formed on an electrode pad.
Figure 4:
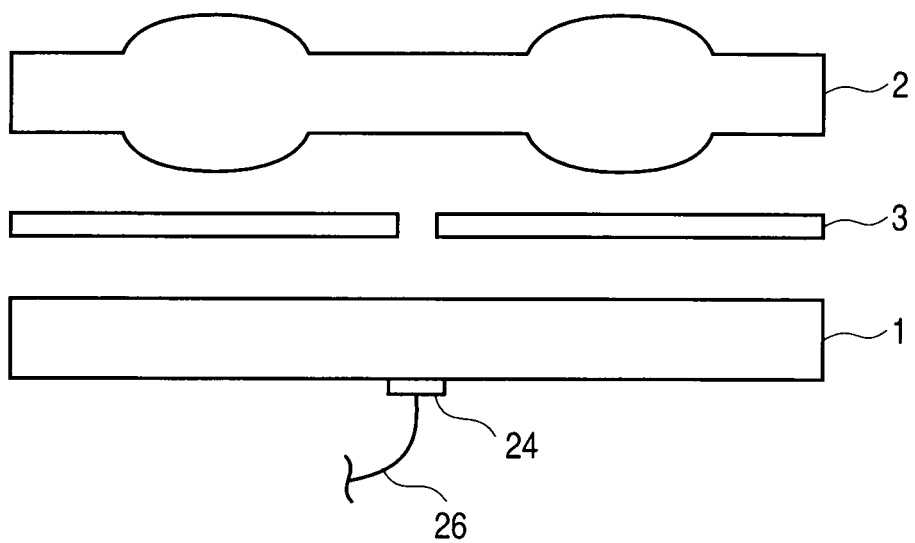
FIG. 4 is a sectional view of the solid-state image pickup apparatus shown in FIG. 1, in which a bonding wire is electrically connected to the electrode pad.

Also in FIG. 2, between the image pickup areas 11 and 12 and between the image pickup areas 13 and 14, all of which are arranged sideways, are a plurality of electrode pads 24 arranged in series in a sideways direction in FIG. 2. These electrode pads 24 are used for outputting signals obtained from the image pickup areas 11 and 14 and for inputting power source voltages and/or drive pulse signals to be supplied to the image pickup areas 11 to 14. As shown in the cross-sectional view in FIG. 3, a ball electrode 25 may be formed on each of the electrode pads 24 by soldering. Alternatively, as shown in the sectional view in FIG. 4, a bonding wire 26 may be electrically connected to each electrode pad 24.

Each of the optical image formation lenses 2 is made of, for example, glass or synthetic resin. These lenses 2 form object images on the image pickup areas 11 to 14 opposite to the interconnect layer formation surface of the semiconductor substrate composing the image pickup chip 1.

The four spectral filters 3 are disposed so as to correspond to the four image pickup areas 11 to 14. As shown in FIG. 1, they are disposed between the optical image formation lenses 2 and image pickup chip 1. In this case, the spectral filter 3 corresponding to the image pickup area 11 (for example) transmits mainly light in the red wavelength range, as indicated by R in FIG. 2. Two spectral filters 3 corresponding to the image pickup areas 12 and 13 disposed on a diagonal line in FIG. 2 transmit mainly light in the green wavelength range, as indicated by G in FIG. 2. Further, in FIG. 2, the spectral filter 3 corresponding to the image pickup area 14 disposed on another diagonal line with respect to the image pickup area 11 transmits mainly light in the blue wavelength range, as indicated by B in FIG. 2.

Figure 5:
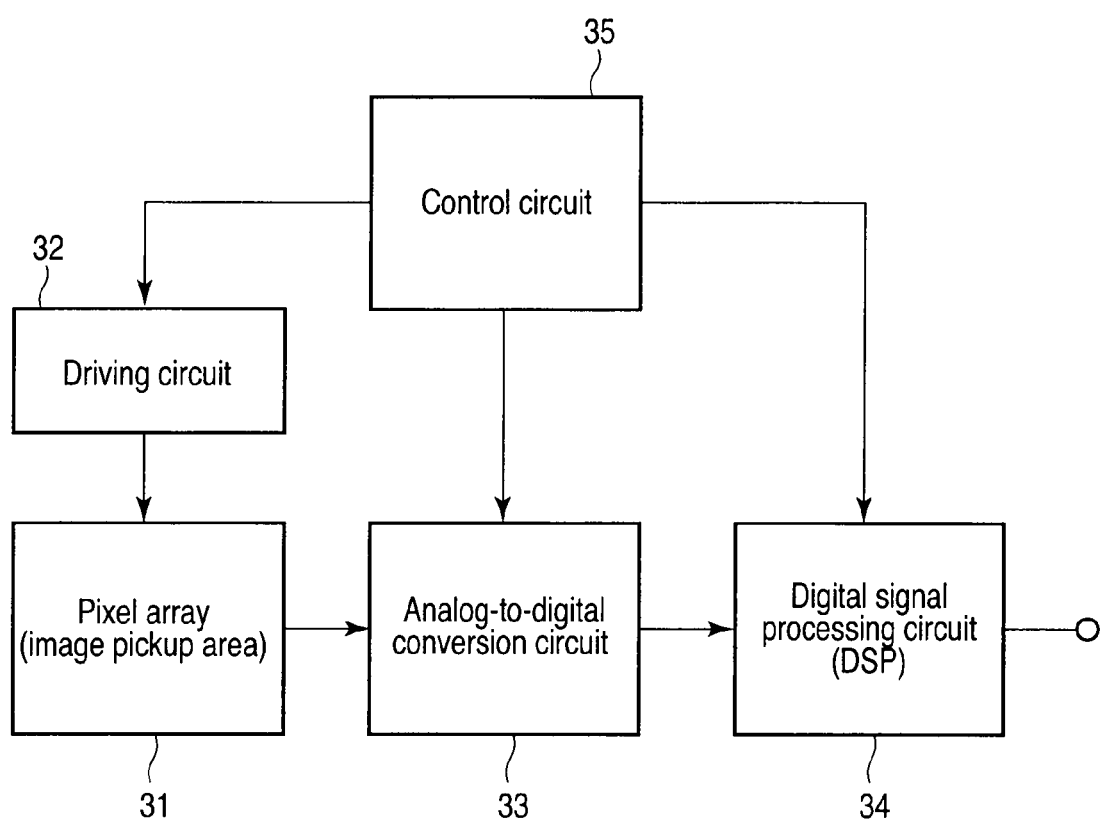
FIG. 5 is a schematic block diagram showing an example of a circuit function of the image pickup chip shown in FIG. 2.

FIG. 5 schematically shows an example of the circuit function of the image pickup chip 1 shown in FIG. 2. Pixel arrays (i.e., image pickup areas) 31 correspond to the four image pickup areas 11 to 14 in FIG. 2, pick up object images formed on the image pickup areas 11 to 14 by the corresponding optical image formation lenses 2 and spectral filters 3, and convert the images by means of unit pixels photoelectrically, thereby capturing B, G and R color signals. Each driving circuit 32 is disposed in the driving circuit area 23 shown in FIG. 2, drives a signal scanning circuit part in the corresponding pixel array 31, selects unit pixels in the pixel array 31 sequentially, and captures color signals from the pixel array 31 sequentially. Analog-to-digital conversion circuits 33 are separately disposed in the analog-to-digital conversion circuit areas 15 to 18 in FIG. 2, and convert color signals captured by the corresponding pixel arrays 31 into digital signals. The digital signal processing (DSP) circuits 34 are separately disposed in the corresponding digital signal processing circuit areas 19 to 22 shown in FIG. 2. Each digital signal processing circuit 34 receives a digital signal converted from a color signal by the analog-to-digital conversion circuit 33, performs pattern matching for the image picked up by the pixel array 31, and then performs signal processing such as image-combining. The control circuit 35 controls the operations of the driving circuits 32, analog-to-digital conversion circuits 33, and digital signal processing circuits 34. This control circuit 35 may be disposed in, for example, the driving circuit area 23 shown in FIG. 2.

FIG. 6 shows an example of an equivalent circuit of one of the image pickup areas 11 to 14, shown in FIG. 2, together with the driving circuit 32 and part of the corresponding analog-to-digital conversion circuit. The four image pickup areas 11 to 14 are identical in structure. Each image pickup area has a plurality of unit pixels (unit cells) 40 arranged in rows and columns. In FIG. 6, only four unit cells 40 (the total of two rows of unit cells×two columns of unit cells) are shown for ease of explanation. However, the number of unit cells is not limited. This image pickup area further includes a plurality of horizontal address lines 41, reset lines 42, and vertical signal lines 43.

Disposed in the driving circuit 32 (shown in FIG. 5) are a vertical shift register circuit 44 as a row selection circuit, a horizontal shift register circuit 45 as a column selection circuit, a plurality of load transistors 46, a plurality of horizontal select transistors 47, and a horizontal signal line 48.

Each unit cell 40 includes: a photodiode 51; a read transistor 52, which reads an output signal (photoelectric conversion signal) from the photodiode 51; an amplifying transistor 53, which amplifies the output signal from the read transistor 52; a vertical select transistor 54, which selects a vertical line for reading an output signal from the amplifying transistor 53; and a reset transistor 55, which resets the output of the photodiode 51. The drains or sources of the vertical select transistor 54 and reset transistor 55 are connected to a common node. This common connection node is supplied with a power source voltage and/or a drive pulse signal output from a drive pulse signal generating circuit. In each unit cell 40, the photodiode 51 constitutes a photoelectric conversion part; and the read transistor 52, amplifying transistor 53, vertical select transistor 54, and reset transistor 55 constitute a signal scanning circuit part.

Each horizontal address line 41 is laid so as to extend horizontally from the vertical shift register circuit 44. This line 41 specifies a row from which a signal is to be read. This horizontal address line 41 is connected in common to the gates of the vertical select transistors 54 of the unit cells 40 arranged in a single row.

Each reset line 42 is laid so as to extend horizontally from the vertical shift register circuit 44. This line 42 specifies a row which is to be reset. The rest line 42 is connected in common to the gates of the reset transistors 55 of unit cells 40 arranged in a single row.

Each vertical signal line 43 is connected in common to the sources of the amplifying transistors 53 in the corresponding unit cells 40 arranged in a single column. Connected to one end of each vertical signal line 43 is the load transistor 46; connected to the other end thereof is one end of the corresponding analog-to-digital converter 49 disposed in the corresponding analog-to-digital conversion circuit 33. The other end of each analog-to-digital converter 49 is connected to the common horizontal signal line 48 via the corresponding horizontal select transistor 47. The horizontal select transistors 47 are selectively driven by selection pulses output from the horizontal shift register circuit 45.

The operation of the circuit in FIG. 6 will now be described briefly. First, a high address pulse signal is applied to the horizontal address lines 41 from the vertical shift register circuit 44, and the vertical select transistors 54 in the corresponding unit cells 40 arranged in a single row are turned on. Consequently, a voltage almost equal to the gate voltage of the amplifying transistor 53, that is, the voltage of the photodiode 51, is output to the corresponding vertical signal line 43 by a source follower circuit including the load transistor 46 and the amplifying transistor 53 disposed in each of the unit cells 40 of a selected row. These voltages received by the vertical signal lines 43 are digitized by the corresponding analog-to-digital converters 49.

Then, the horizontal shift register circuit 45 sequentially applies high horizontal selection pulse signals to the horizontal select transistors 47, thereby sequentially outputting signals for one row to the horizontal signal line 48. This operation is continuously performed in successive rows, thereby reading signals from all the unit cells arranged two-dimensionally.

FIG. 7 shows in detail a cross-section of the structure of the image pickup areas of the image pickup chip 1, shown in FIG. 2, together with the spectral filter 3. Formed in the silicon semiconductor substrate 61 is a plurality of unit cells 62. Formed in an insulation film on the surface of the semiconductor substrate 61 are a plurality of interconnect layers 63 formed from, for example, aluminum or copper. Formed on the back of the semiconductor substrate 61 but separated from it by an antireflection film 64 (used to decrease the reflectance of incident light yet allow the incidence of more light) is a plurality of microlenses 65 arranged so as to correspond to the unit cells 62. Above the microlenses 65 are the spectral filters 3 that transmit light in the red, green, or blue wavelength ranges. The spectral filters 3, antireflection film 64, and microlenses 65 constitute the optical image formation system together with the optical image formation lens 2.

As shown by the arrow in FIG. 7, optical image formation lenses 2 in FIG. 1 form object images on the image pickup areas of the semiconductor substrate 61 and opposite the interconnect layer 63 thereof.

In the solid-state image pickup apparatus according to the first embodiment, images are formed on the image pickup areas 11 to 14 by the corresponding optical image formation lenses 2 independently, and the spectral filters 3 are also disposed in these areas 11 to 14 independently. In the configuration where image pickup areas are disposed for the corresponding colors in the manner described above, only unit cells having the same colors are located near one another. This prevents crosstalk between the unit cells and yields satisfactory spectral characteristics free from color mixing. This makes it possible to ensure excellent color reproducibility on a reproducing screen.

Figure 8:
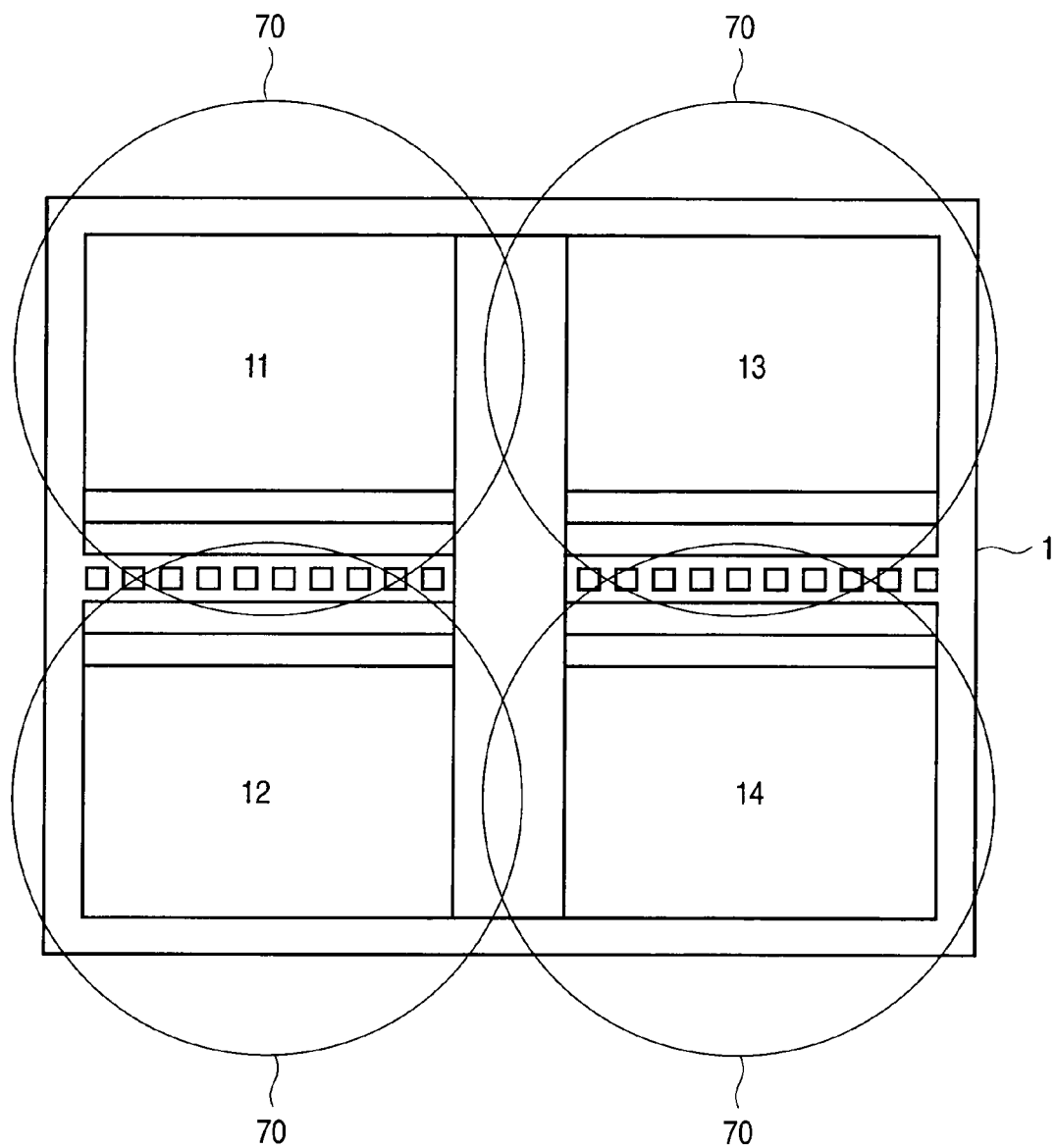
FIG. 8 is a plan view of object images formed on four image pickup areas in the image pickup chip by the image pickup chip and an optical image formation lens, which are shown in FIG. 2.

FIG. 8 is a plan view showing the image pickup chip 1 shown in FIG. 2, together with object images formed on the four image pickup areas 11 to 14 on the image pickup chip 1 by the optical image formation lenses 2. In FIG. 8, image circles 70 indicate the object images in the image pickup areas 11 to 14.

As shown in FIG. 8, the solid-state image pickup apparatus according to the first embodiment makes it possible to define the image pickup areas as separated by distances sufficient to prevent the image circle 70 in each of the image pickup areas 11 to 14 from extending into any of the other image pickup areas. As a result, this makes it possible to avoid the problem that an object image is also formed even in an image pickup area that is not assigned for this image. The driving circuit 32, analog-to-digital conversion circuits 33, digital signal processing circuits 34, control circuit 35, electrode pads 24, etc., which are required for the solid-state image pickup apparatus are disposed between the image pickup areas 11 to 14, and these circuits are not disposed on the peripheries of the image pickup areas 11 to 14. This makes it possible to reduce the size of a unit cell to that of a conventional unit cell.

Furthermore, in the solid-state image pickup apparatus according to the first embodiment, object images are formed by the optical image formation lenses 2 on the image pickup areas 11 to 14 of the semiconductor substrate and opposite the interconnect layer 63 thereof. This makes it possible to make light incident on the silicon semiconductor substrate without being intercepted by the interconnect layer 63, thus yielding highly efficient light utilization.

In addition, the bonding wires are disposed on the face opposite to that onto which light is emitted. Accordingly, even when electrode pads are disposed between the image pickup areas, blocking of incident light is prevented regardless of the positions from which the bonding wires are connected to the electrode pads.

Second Embodiment

Figure 9:
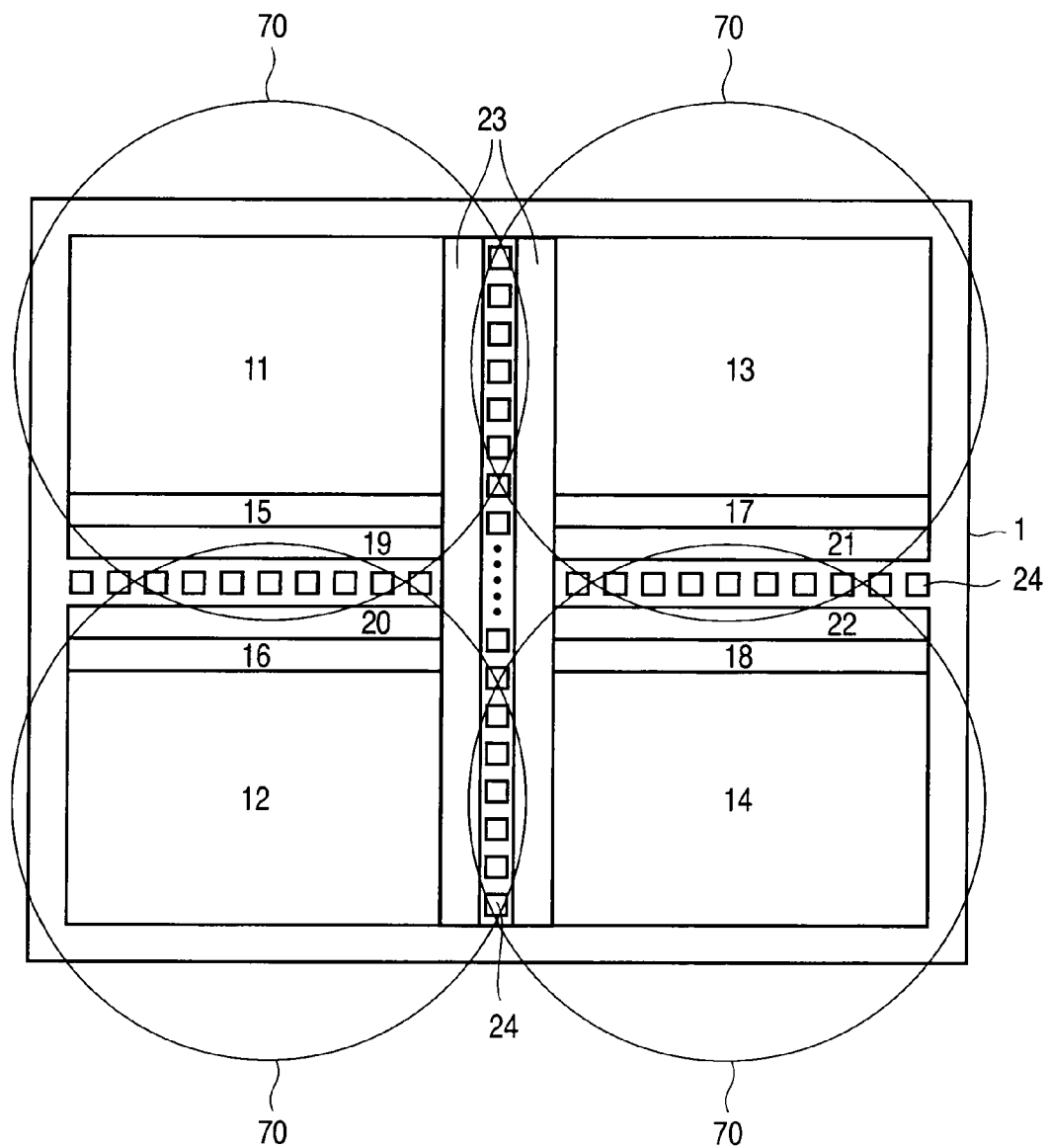
FIG. 9 is a plan view showing an image pickup chip used in a solid-state image pickup apparatus according to a second embodiment and also showing object images formed on four image pickup areas in the image pickup chip.

FIG. 9 is a plan view of an image pickup chip 1 used in a solid-state image pickup apparatus according to a second embodiment, together with object images formed on four image pickup areas 11 to 14 in the image pickup chip 1. In this case also, image circles 70 indicate object images on the image pickup areas 11 to 14.

In a solid-state image pickup apparatus according to the present embodiment, the driving circuit area 23 of the image pickup chip 1 shown in FIG. 2 is divided into two smaller areas in left and right directions (i.e., sideways) as viewed from FIG. 2, and a plurality of electrode pads 24 are also arranged in series vertically between these areas.

In other words, in the solid-state image pickup apparatus according to the second embodiment, the electrode pads 24 (which are used to output signals obtained in the image pickup areas 11 to 14 and to input power source voltages and/or drive pulse signals to be supplied to the image pickup areas 11 to 14) are arranged not only in one direction on the chip but also in a direction intersecting this direction.

In this case as in the first embodiment, ball electrodes 25 may be formed on the electrode pads 24 or bonding wires 26 may be electrically connected to the electrode pads 24.

The second embodiment yields the same effects as the first embodiment.

Third Embodiment

Figure 10:
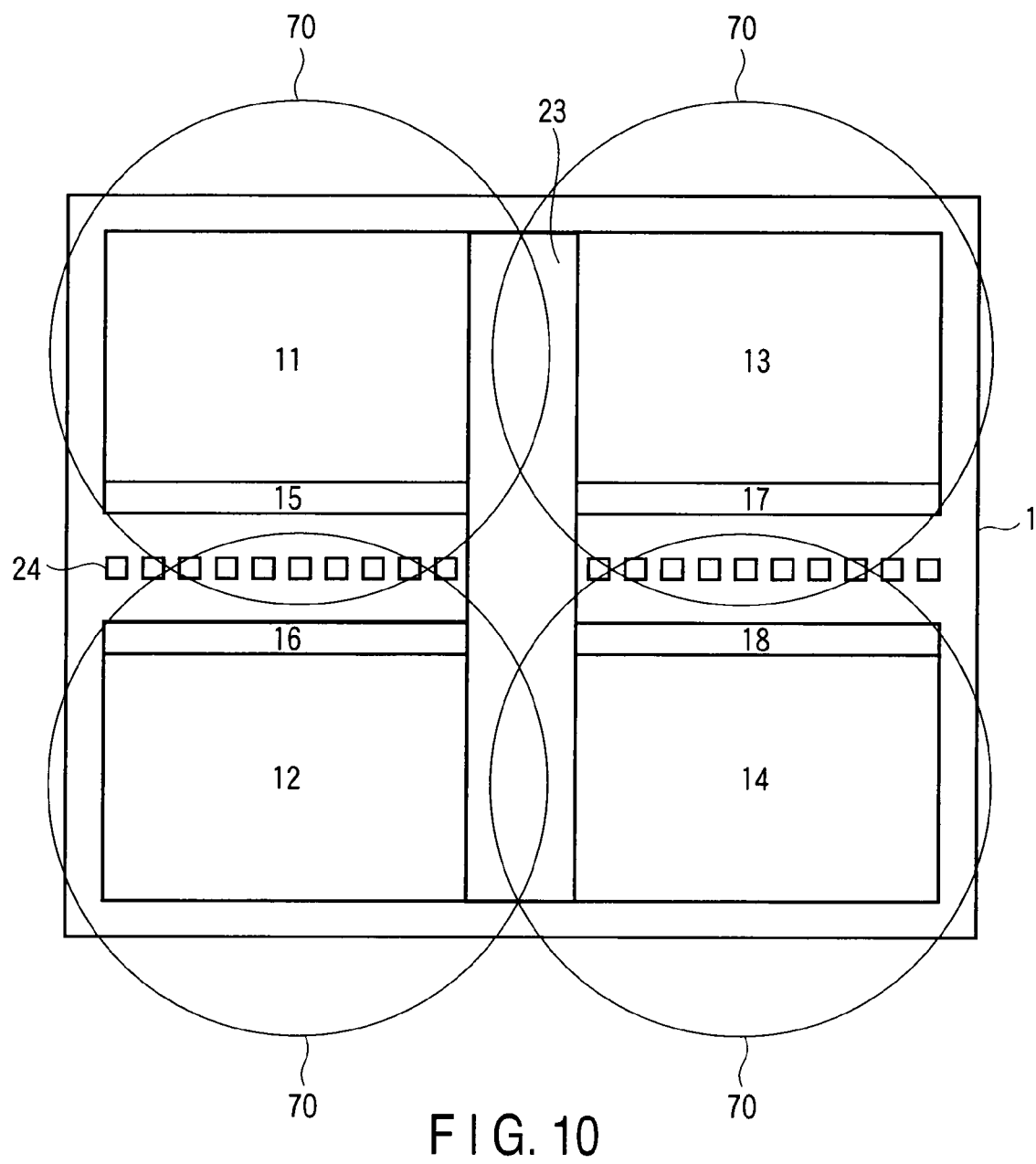
FIG. 10 is a plan view showing an image pickup chip used in a solid-state image pickup apparatus according to a third embodiment and also showing object images formed on four image pickup areas in the image pickup chip.

FIG. 10 is a plan view of an image pickup chip 1 used in a solid-state image pickup apparatus according to a third embodiment, together with object images formed on four image pickup areas 11 to 14 in the image pickup chip 1. In this case also, image circles 70 indicate object images on the image pickup areas 11 to 14.

The image pickup chip 1 according to the third embodiment does not include the digital signal processing circuit areas 19 to 22 shown in FIG. 2. Accordingly, the digital signal processing circuits 34 shown in FIG. 5 are also omitted. In this embodiment, signal processing such as image-combining is performed outside the chip.

The third embodiment also yields the same effects as the first embodiment.

Each embodiment has been described using as an example the case where the spectral filters 3 are disposed between the optical image formation lenses 2 and image pickup chip 1. However, this design may be modified such that the spectral filters 3 are disposed between the optical image formation lenses 2 and the object or on the semiconductor substrate used as the image pickup chip 1. In addition, the spectral filters 3 shown in FIG. 7 may be formed between the microlenses 65 and the antireflection film 64. Alternatively, the spectral filters 3 may be formed on the microlenses 65 and between the microlenses 65 and antireflection film 64.

Further, each embodiment has been described as an example of a case where the analog-to-digital conversion circuit areas 15 to 18 are disposed in contact with the image pickup areas 31. However, they may be disposed in other areas such as the driving circuit area 23 or in other areas around the chip.

In each solid-state image pickup apparatus according to the present invention, the face onto which light is emitted in the image pickup area is the surface of the substrate which is opposite the interconnect layer thereof. Accordingly, incident light is prevented from being intercepted by the interconnect layer. This makes it possible to maintain high quantum efficiency despite a pixel size reduction and hence to obtain a reproduced image of high image quality with a satisfactory signal-to-noise ratio.

In addition, a plurality of unit pixels in each of the image pickup areas receive incident light transmitted through the same spectral filter. Accordingly, despite a pixel size reduction, color mixing is prevented and hence color reproducibility on a display screen improves remarkably. Additionally, disposed between the image pickup areas are: the driving circuit for driving the image pickup areas; the electrode pad provided to supply power source voltages and/or drive pulse signals to be supplied to the image pickup device and provided to output signals from the image pickup device; and the digital signal processing circuits for performing the process of outputting signals from the image pickup areas. The image pickup areas are separated from one another with sufficient spaces therebetween. This prevents incident light from different combining optical systems from encountering, and thus yields a satisfactory reproduced image free from false signals.

Furthermore, the electrode pads provided to supply power source voltages and/or driving pulse signals to the image pickup areas or provided to output signals from the image pickup areas may be disposed opposite the face onto which light is emitted. This prevents the bonding wires extending from the electrode pads from entering the optical image formation system and image pickup areas, thus yielding a satisfactory reproduced image free from false signals.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A solid-state image pickup apparatus comprising:
a semiconductor substrate having a first main surface and a second main surface;
a plurality of image pickup areas checker-wise arranged in first rows-and-columns in the semiconductor substrate, the image pickup areas being separated from one another and each having second rows and columns of unit pixels, each of the unit pixels including a photoelectric conversion part and a signal scanning circuit part;
an image pickup device optical system configured to form object images on said plurality of image pickup areas on the first main surface of the semiconductor substrate;
a driving circuit area disposed in the semiconductor substrate, between adjacent ones of said plurality of image pickup areas in a row direction, the driving circuit area having a driving circuit formed to drive the signal scanning circuit part;

a plurality of analog-to-digital converters arranged between adjacent ones of the said plurality of image pickup areas in a column direction, to digitize signals obtained from said plurality of image pickup areas;

a plurality of digital signal processing circuit areas arranged between the adjacent ones of said plurality of image pickup areas in the column direction, and having a plurality of signal processing circuits that perform signal processing upon input of digital signals produced as a result of the conversion performed by the analog-to-digital converters in said plurality of analog-to-digital conversion circuit areas;

an interconnect layer formed on the second main surface of the semiconductor substrate on an opposite side to a side on which the image pickup device optical system is formed; and a plurality of electrode pads disposed on a portion of the second main surface between the adjacent ones of said plurality of image pickup areas in the column direction, used to output signals processed in said plurality of digital signal processing circuit areas and receive power source voltages and/or drive pulse signals to be supplied to said plurality of image pickup areas, wherein said plurality of image pickup areas are formed in the semiconductor substrate to be separate from one another by distances sufficient to prevent object images formed by corresponding ones of the image pickup device optical systems from overlapping one another, said plurality of electrode pads are formed on the same surface of the semiconductor substrate on which the interconnect layer is formed, and incident light is emitted onto the image pickup area formed in the first main surface of the semiconductor substrate, which is opposite to the second main surface of the semiconductor substrate on which the interconnection layer is formed.

2. The apparatus according to claim 1, wherein said plurality of image pickup areas are four image pickup areas arranged in two rows and two columns.

3. The apparatus according to claim 1, wherein the image pickup device optical system includes optical image formation lenses that form object images to correspond to said plurality of image pickup areas.

4. The apparatus according to claim 1, wherein the image pickup device optical system includes a plurality of spectral filters disposed over said plurality of image pickup areas, respectively, and said plurality of image pickup areas are exposed to light transmitted through said plurality of spectral filters and thereby receive different spectrum light of the object image.

5. The apparatus according to claim 1, wherein the image pickup device optical system includes a plurality of microlenses and antireflection films disposed over said plurality of image pickup areas, respectively.

6. The apparatus according to claim 1, further comprising:
a plurality of first electrode pads disposed between the adjacent ones of said plurality of image pickup areas in the column direction, said plurality of first electrode pads being formed on the same surface of the semiconductor substrate on which the interconnect layer is formed.

7. The apparatus according to claim 6, further comprising:
a plurality of second electrode pads disposed between the adjacent ones of said plurality of image pickup areas in the row direction, said plurality of second electrode pads being formed on the same surface of the semiconductor substrate on which the interconnect layer is formed.

* * * * *